(12) United States Patent
Rausch et al.

(10) Patent No.: US 12,140,245 B2
(45) Date of Patent: Nov. 12, 2024

(54) ELECTRIC FIELD DEVICE (71) Applicant: SAMSON AKTIENGESELLSCHAFT, Frankfurt am Main (DE)

(72) Inventors: Sven Rausch, Nidderau (DE); Nikolai Schulz, Eppertshausen (DE); Christopher Bode, Eschborn (DE)

(73) Assignee: SAMSON AKTIENGESELLSCHAFT, Frankfurt am Main (DE)

( * ) Notice: Subject to any disclaimer, the term of this patent is extended or adjusted under 35 U.S.C. 154(b) by 253 days.

(21) Appl. No.: 17/919,743

(22) PCT Filed: Apr. 20, 2021

(86) PCT No.: PCT/EP2021/060276
§ 371 (c)(1),
(2) Date: Oct. 18, 2022

(87) PCT Pub. No.: WO2021/214084
PCT Pub. Date: Oct. 28, 2021

(65) Prior Publication Data
US 2023/0160491 A1 May 25, 2023

(30) Foreign Application Priority Data
Apr. 20, 2020 (DE) .................... 20 2020 102 186.9

(51) Int. Cl.
F16K 31/02 (2006.01)
F16K 37/00 (2006.01)
(Continued)

(52) U.S. Cl.
CPC .......... F16K 31/02 (2013.01); F16K 37/0083 (2013.01); H05K 5/0052 (2013.01); H05K 7/1462 (2013.01)

(58) Field of Classification Search
CPC ........ H02K 7/116; H02K 11/21; H02K 5/136; H02K 11/33; F16K 31/12
(Continued)

(56) References Cited

U.S. PATENT DOCUMENTS 6,392,322 B1 * 5/2002 Mares .................... H02K 11/33
310/12.32

FOREIGN PATENT DOCUMENTS

EP 0866532 A2 * 2/1998
EP 0866532 9/1998
(Continued)

OTHER PUBLICATIONS

Utility Model No. 20 2020 102 186.9, Research Report, English Translation, 3 Pages.
(Continued)

Primary Examiner — Jose A Gonzalez Quinones
(74) Attorney, Agent, or Firm — WOODLING, KROST AND RUST (57) ABSTRACT The invention relates to an electric field device (10) with an ignition protection-type pressure-tight encapsulation for use in explosion-prone regions for controlling and/or regulating a valve unit of a process system, comprising a housing (12), in which a control unit (48) that comprises electronic components and is used as a monitoring, control, and/or regulating unit is arranged, said control unit (48) having a releasable communication connection to an operating unit (62). The housing (12) can be connected to a drive housing of the valve unit via a mechanical interface (42), and the housing has at least one connection feedthrough (44), via which at least one line can be connected that is connected to the control unit (48) via a connection interface (46). The invention is characterized in that the housing (12) is designed as a housing assembly with a modular structure,
(Continued)

having a first module (16) which is formed together with the mechanical interface (42) to the drive housing and the connection feedthrough (44). The control unit (48) is secured in the first module (16) and has an interface to a control center, wherein the first module (16) can be mechanically connected to a cover element (20) selectively either directly or indirectly in a releasable manner, and the indirect connection of the first module (16) to the cover element (20) is produced with the interposition of a second module (18). The operating unit (62) is arranged in a stationary manner in the second module (16), and the second module (18) can be fixed in different angular orientations about a longitudinal axis of the electric field device relative to the first module (16).

17 Claims, 5 Drawing Sheets

(51) Int. Cl.
*H02K 7/116* (2006.01)
*H02K 11/21* (2016.01)
*H02K 11/33* (2016.01)
*H05K 5/00* (2006.01)
*H05K 7/14* (2006.01)

(58) Field of Classification Search
USPC .................................. 310/12.04, 37, 80, 88
See application file for complete search history.

(56) References Cited

FOREIGN PATENT DOCUMENTS

EP 2016318 9/2016
WO WO-9520780 A1 * 8/1995

OTHER PUBLICATIONS

Utility Model No. 20 2020 102 186.9, Research Report, 1 Pages.
Utility Model No. 20 2020 102 186.9, Research Report, English Translation of Section C, 1 Page.
Utility Model No. 20 2020 102 186.9, Research Report, Section C. 1 Page.
The International Bureau of WIPO, International Preliminary Report on Patentability, Oct. 26, 2022, p. 1, International Application No. PCT/EP2021/060276.
The International Searching Authority, The International Bureau of WIPO, English Translation of the Written Opinion of the International Searching Authority, pp. 2-8, International Application No. PCT/EP2021/060276.
The International Bureau of WIPO, The Notification of Transmittal of Translation of the International Preliminary Report on Patentability, Nov. 3, 2022, p. 1, International Application No. PCT/EP2021/060276.
European Patent Office, International Search Report, Jul. 29, 2021, pp. 1-3, International Application No. PCT/EP2021/060276.
European Patent Office, Written Opintion, International Application No. PCT/EP2021/060276.

* cited by examiner

ELECTRIC FIELD DEVICE

This patent application is the national phase entry into the United States of America of PCT/EP2021/060276, international application filing date Apr. 20, 2021.

This patent application claims the benefit and priority of and to German patent application No. 20 2020 102 186.9, filed Apr. 20, 2020. German patent application No. 20 2020 102 186.9, filed Apr. 20, 2020 is incorporated herein by reference hereto in its entirety. PCT/EP2021/060276, international application filing date Apr. 20, 2021, is incorporated by reference hereto in its entirety.

In processes in the chemical and petrochemical industry, the formation of an explosive atmosphere cannot usually be ruled out. In this case, the plant components used, for example electric field devices such as positioners, must meet special explosion protection requirements. In the case of the "Ex d" type of pressure-tight encapsulation, the mode of operation is based on the containment of any explosion that may occur inside the housing, so that a transfer of the explosion to the atmosphere surrounding the housing is prevented. This is achieved by an explosion-proof design of the housing together with flameproof gaps at all openings of the housing, whereby the electrical components that can ignite an explosive atmosphere are enclosed in the housing. The requirements for equipment of the pressure-tight encapsulation type of ignition protection are described in the EN 60079-1 standard.

EP 0 866 532 A2 describes a housing for an electrical circuit for use in explosion-hazard areas. A partition provided in the housing divides the latter into an electronics compartment and a terminal compartment. The electronics compartment and the terminal compartment each have a detachable sealed cover member. A flameproof electrical feedthrough is associated with the partition, which feedthrough is electrically connected to electronic boards on the side of the electronics compartment. On the side of the terminal compartment, there is an electrical connection to the terminals and a connection member for an operating unit, which is arranged either at a distance from the location of the housing, or directly on the housing, and is adapted to be rotatable relative to the housing.

DE 198 10 350 A1 describes an electric field device of the pressure-tight encapsulation type of ignition protection, which is formed from at least two modules that are coupled both mechanically and electrically. A first module thereof has a terminal compartment for connecting the field device in an explosion-hazard area having a safety barrier arranged therein, and a housing of the pressure-tight encapsulation type of ignition protection. A second module, which has characteristics of a field device of the intrinsically safe ignition protection type, can also be opened in the explosion-hazard area for adjustment and maintenance purposes. The electrical connection between the two modules includes an ignition-proof cored conductor bushing, and the electrical signal connections of the second module are implemented via the cored conductor bushing.

EP 2 016 318 B1 discloses a process valve that has a housing assembly with a modular structure for control electronics, i.e. for monitoring, control and/or regulating electronics. According to the requirements of the process valve, the housing assembly is optionally composed of a predetermined limited supply of modules in combination with a cover element which comes in two different types. The respective cover elements are formed with an operating unit, which has a display and operating element, and accommodate the entire control electronics, which control electronics are formed with different circuit boards according to the requirements of the process valve. All modules and the respective cover element can be connected to one another via identical connection points. The housing assembly is connected to a drive housing of the process valve by means of an adapter part. A retaining ring is arranged in the adapter part, which ring enables the housing assembly to rotate relative to the drive housing.

It is the object of the invention to improve on an electric field device of the type specified in such a way that the field device can be easily adapted to different space conditions of a process plant, taking into consideration good accessibility, readability and operation as well as simple feed conditions.

In a manner known per se, an electric field device of the ignition protection type of pressure-tight encapsulation for use in potentially explosive areas for controlling and/or regulating a valve unit of a process plant, comprises a housing, in which a control unit that comprises electronic components and is used as a monitoring, control and/or regulating unit is arranged. The explosion-proof housing is of a design in accordance with standard EN 60079-1, is provided with seals and has ignition-proof gaps at all openings of the housing, so that pressure-tight encapsulation of the electronic components is ensured, with the result that any possible explosion inside the housing will not affect the surrounding explosive atmosphere.

The control unit has a detachable communication connection to an operating unit. The control unit is operationally connected to the operating unit, which can be integrated in the housing, for example, and in particular can comprise display, indicator and/or operating elements.

The housing is connected to a drive housing of the valve unit via a mechanical interface. The connection can be made, for example, via a screw connection.

The housing has connection feedthroughs via which lines are connected. The connection feedthroughs are preferably in the form of cable glands. The lines are connected to the control unit via a connection interface. For this purpose, the connection interface can be designed with connection terminals, for example. The connection terminals may, for example, be integrated in the control unit, or they may be arranged separately from the control unit.

According to the invention, the housing is designed as a housing assembly with a modular structure. The modular structure allows individual housing components to be selectively combined for adapting it specifically to the requirements of the process valve.

The modular housing assembly has a first module formed with the mechanical interface for connection to a drive housing. Preferably, the mechanical interface of the first module has holes, for example, through which it can in particular be screwed to the drive housing. Positioning the electric field device directly on the drive housing makes it possible to connect the control unit of the electric field device electrically as well as pneumatically to the drive in a simple manner, with the result that positioning and/or control of the actuator of the valve unit can be performed via the control unit.

The first module is formed with connection feedthroughs. If the connection feed-throughs are designed in the form of a cable gland, the lines, in particular cables, can be guided through the cable gland into the interior of the module. If the connection feedthrough is designed in the form of plug-in connections, the lines can be connected thereto. The lines are connected to the control unit via the connection interface.

The control unit is secured in the first module and is installed in a stationary manner with respect to the first module. Bidirectional communication with the electric field device is possible via the control unit. On the one side, this is possible via the operating unit, which is adapted to be electrically connected to the control unit. The control unit also has an interface to a control center so that the control unit can be alternatively monitored and/or operated from a position remote from the site of the housing.

Communication between the control center and the control unit can, for example, take place via a BUS system. This arrangement is particularly advantageous for systems that are difficult to access, are exposed to particularly harsh environmental conditions or increased vibration stresses.

The first module can be mechanically connected to a cover element, selectively either directly or indirectly, in a releasable manner. The direct connection of the first module to the cover element features a housing assembly having a short overall length. Advantageously, the housing assembly in this configuration is of low weight as well as small in size. In particular, the housing has a small axial extent, allowing it to be adapted easily to a process plant where only limited space is available for installation of the electric field device.

Indirect connection of the first module to the cover element is made with the interposition of a second module. The modular structure of the housing assembly allows for differently assembled configurations of the housing using a uniform cover element as well as a uniform first module. Thus, in an alternative housing assembly, the first module is connected to the second module, which in turn is connected to the cover element. By using a uniform cover element as well as a uniform first module, which serve as the base body for the different housing assemblies, the modular structure has a simplified arrangement with a small number of housing components.

The operating unit is arranged in a fixed position in the second module. The second module is designed to accommodate the operating unit. In particular, the second module can have a recess in which the operating unit is arranged, for example, behind a pressure-resistant viewing window.

Furthermore, the second module can have a plurality of connection feedthroughs. The connection feedthroughs can be formed at a plurality of positions in the circumferential direction of the second module. Lines can be connected to the connection feedthroughs, which former are electrically connected to the control unit via the connection interface, which can in particular have connection terminals.

The second module is adapted to be secured to the first module in different angular orientations about a longitudinal axis of the electric field device with respect to the first module. The longitudinal axis of the electric field device extends orthogonally to the connection plane of the first and second modules.

The first module is secured in a fixed position on the drive housing by means of the mechanical interface. Accordingly, the second module can be secured to the drive housing of the valve unit in different angular orientations relative to the first module and relative to the drive housing. As a result, the positions of the respective connection feedthroughs and the operating unit, which are each arranged in a fixed position relative to the second module, can be optimally adapted to the installation space conditions of the process plant via the different angular orientations of the second module. In this way, the position of the operating unit can be easily adapted to the installation space conditions of the plant, in order to ensure good accessibility, easy readability and easy operation. The same is true for the position of the connection feedthroughs which allow easy adaptation of the feed conditions for the electrical lines to the installation conditions of the plant.

According to a preferred embodiment, the control unit comprises a circuit board which is connected to the connection interface in an electrically conductive manner, which connection interface may comprise connection terminals that may be spatially separated from the control unit. For example, the connection terminals of the connection interface may be arranged in the second module that is disposed remote from the first module in which the control unit is mounted. Separating the connection interface from the control unit allows to make efficient use of the space available in the housing. The connection interface can be arranged directly in the first module, for example, and as a result, the first module can advantageously have a compact over-all length.

Preferably, the operating unit comprises a support element having a display element, an indicator element and/or an operating element arranged thereon. The support element of the operating unit can be designed, for example, as a PCB or board which is used for mechanically fastening and electrically connecting individual electronic elements of the operating unit, e.g. the display, indicator and/or operating elements.

The operating unit is arranged in a stationary manner in the second module and can be used for bidirectional communication of the electric field device via the display, indicator and/or operating elements. The arrangement in a stationary manner with respect to the second module can be achieved, for example, via a screw connection of the support element to the second module.

An operating element carried by the support element, for example an operating screw, can pass through the second module, in particular via a recess so as to enable operation of the electric field device from outside the housing, for example.

The display and/or indicator element can in particular be arranged in a recess in the second module in a stationary manner. In this case, for instance, the recess can be covered by an inspection window, for example a glass pane, which is connected to the second module in a pressure-tight manner.

According to a preferred embodiment, the detachable communication connection between the control unit and the operating unit is made via a connection element, by means of which the support element can be flexibly arranged with respect to the circuit board. The support element, to which the display element, indicator element and/or operating element are attached, is arranged in a fixed position with respect to the second module. By means of the connection element, the support element is flexibly connected to the control unit which is arranged in a fixed position in the first module. The flexibility of the connection between the support element and the circuit board via the connection element allows the control unit to be easily adapted to the angular orientation of the second module with respect to the first module. In other words, the support element, as well as the entire operating unit, can be adapted flexibly to a rotation of the second module about the longitudinal axis of the housing assembly, thus ensuring the positionally fixed arrangement of the operating unit with respect to the second module.

Preferably, the connection element is formed as a plug-in connector on the circuit board of the control unit, the circuit board having a plurality of plug-in connectors at various positions. The position of the support element on the circuit board of the control unit can be changed by reconnecting it to the plug-in connectors, which reconnection of the support element is done in such a way that the stationary arrangement of the support element with respect to the second module is ensured in the event of a change in the angular orientation of the second module with respect to the first module. For this purpose, the board reflects the symmetry requirements of the second module by means of the arrangement of the plug-in connectors, so that the positions of the display and/or indicator elements and of the operating element, that are arranged on the support element, can be adapted to the position each of the cutout and the recess of the second module, respectively. By flexibly reconnecting it to differently positioned plug-in connectors of the board of the control unit, the support element of the operating unit can be adapted to the angular orientation of the second module with respect to the first module.

In an alternative embodiment, the support element is connected to the circuit board by means of a cable connection. The flexible cable connection enables the support element to be rotated around a wide angular range, in particular of more than 180°, so that in particular also an angular range of up to 360° with respect to the circuit board of the control unit is obtained. In this embodiment, the support element may in particular be connected to the second module in a releasable manner, for example using a screw connection. The support element is arranged in a constant position relative to the second module. Thus, the position of the support element, to which the display, the indicator and/or operating element is mechanically connected, can be changed exclusively via the angular orientation of the second module relative to the first module.

According to a preferred embodiment, the first module, the second module and the cover element each have a connection area via which they can each be mechanically connected to one another. The respective connection areas are of defined uniformly, so that the first module can be optionally connected to the second module and to the cover element. In the respective connection areas, the first module, the second module and the cover element are centered in relation to one another in an identical manner and can be connected to one another.

Preferably, the respective connection areas have a rotationally symmetrical cylindrical transition, with the respective transitions engaging in one another in such a way that they each have axially abutting surfaces. For example, the transition of the cover element may engage the transition of the first module and/or the second module, with the transition of the respective first or second module radially engaging around the transition of the cover element. In the same way, the transition of the second module may engage the transition of the first module. The respective interengaging transitions are rotationally symmetrical and cylindrical in shape and have axially abutting surfaces in the assembled state of the housing assembly.

According to a preferred embodiment, the respective connection areas can be connected to one another via a positive and/or non-positive connection. In this way, the connection can be made by the geometric contact of two active surfaces of the respective connection areas and/or the connection is caused by a system of friction-related forces.

Preferably, the connection is made in the axial direction via a screw connection of a pair of holes of the respective connection areas. In particular, the respective connection areas can be connected to one another in a releasable manner via a flange, with a screw connection applying a contact pressure to the flange. A respective connection area can, for example, have a flange face with holes that form a hole pattern. By means of a pair of holes of the hole patterns in the respective flange faces, the housing parts to be connected to one another can be positioned in a centered manner relative to one another. In this case, the angular orientation of the second module relative to the first module depends on the narrowness of the grid of the respective hole patterns.

According to a particularly preferred embodiment, the connection area of the second module is continuously adjustable with respect to the connection area of the first module. The respective connection areas of the first module and the second module can, for example, be formed with an external thread which can be screwed into the internal thread of a movable threaded piece, the movable threaded piece being formed, for example, as a union nut. The union nut can, for example, radially embrace the respective connection areas of the first and second modules, and can be fixed to the housing via a shoulder, for example, that is formed on the housing. In this way, the angular orientation of the second module relative to the first module about the longitudinal axis of the electric field device can be adjusted continuously in an advantageous manner so that the operating unit formed on the second module and connection feedthroughs can assume a position that is optimally adapted to the specific installation space of the plant.

Preferably, the connection area of the second module has a pattern of elongated holes. In particular, the respective connection areas of the first and second modules can be connected to one another in a releasable manner, via a flange, with the connection area of the second module having a flange face that has a pattern of elongated holes formed in it. This allows continuous adjustment of the angular orientation of the second module relative to the first module.

Preferably, the first module has a rotational stop with respect to the second module. A mechanical stop limits the angular orientation of the second module relative to the first module. This makes an angle change of the second module with respect to the first module of nearly 360° possible. In particular, this prevents the cable connection between the control unit and the operating unit from being impaired by overtwisting.

According to one embodiment, a position detection sensing means for a position measurement of a valve member position is arranged in the first module. The position detection sensing means may be a magnet whose field strength or field line direction is read by a magnet-sensitive sensor as a function of position. For this purpose, the magnet can be positioned outside the positioner housing and the magnet-sensitive sensor can be positioned inside the positioner, for example, in order to determine a respective position of a valve rod. The position detection sensing means is integrated in the first module, which serves as a base body for the different configurations of the housing assemblies and is arranged immediately adjacent to the drive housing.

Preferably, an IP converter is arranged in the first module. The IP converter is electrically connected to the control unit that is used to monitor, control and/or regulate the valve unit. It is used to control the pneumatic drive of the control valve and regulates a discharge pressure as a function of an electrical control signal.

Additional advantages, features and possible applications of the present invention will be apparent from the description which follows, in which reference is made to the embodiments illustrated in the drawings.

Throughout the description, the claims and the drawings, those terms and associated reference signs are used as are stated in the list of reference signs which follows below. In the drawings.

Figure 1:
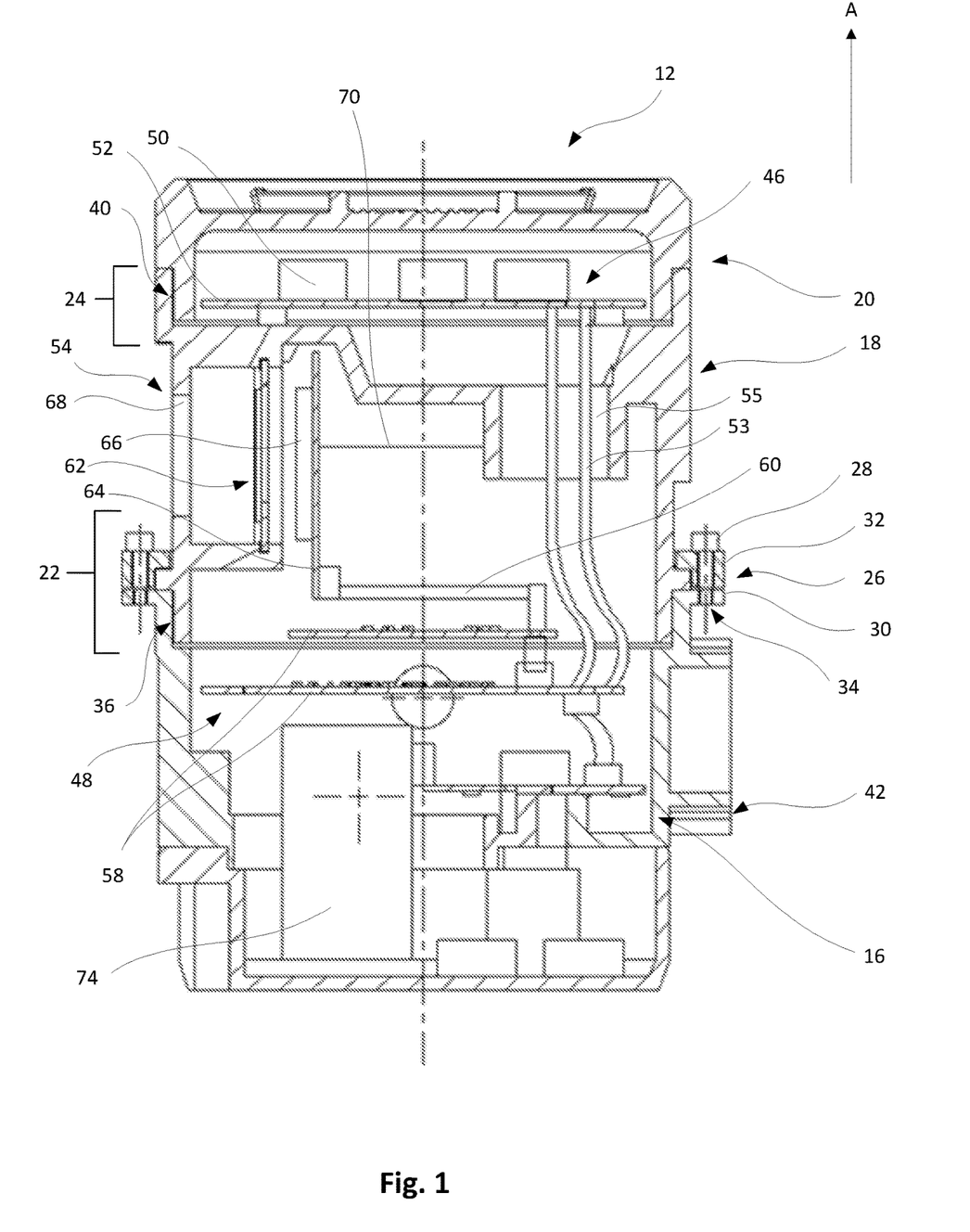
FIG. 1 is an axial longitudinal sectional view of an electric field device according to the invention.

FIG. 1 is an axial longitudinal sectional view of an electric field device 10. The electric field device 10 is designed as a positioner 10 for monitoring, controlling and/or regulating a valve unit 14 (not shown here) of a process plant.

The electric field device 10 is provided with a housing 12 having a pressure-tight encapsulation for use in potentially explosive atmospheres. The housing 12 is formed as a housing assembly 12 with a modular structure, comprising a first module 16, a second module 18 and a cover element 20. The first module 16 can be mechanically connected to the cover element 20 selectively either directly or indirectly in a releasable manner. In the present case, the first module 16 is indirectly connected to the cover element 20 with the interposition of the second module 18.

The connection of the first module 16 to the second module 18 and the connection of the second module 18 to the cover element 20 takes place in a respective connection area 22, 24. Owing to the identical design of each of the connection areas 22, 24, only the connection area 22, by means of which the first module 16 is connected to the second module 18, will be described in detail here.

In the present case, the connection area 22 has a flange connection 26 that is used to mechanically connect the second module 18 to the first module 16. A contact pressure is applied to the flange connection 26 via screw connections 28. The flange connection 26 is formed by the flange face 30 formed on the first module 16 and the flange face 32 formed on the second module 18.

The flange sheets 30, 32 each have holes 34 in them that form a hole pattern. Via a pair of holes of the respective hole patterns, the second module 18 can be arranged in different angular orientations relative to the first module 16 about a longitudinal axis A of the positioner 10, which longitudinal axis A extends orthogonally to the plane connecting the first module 16 to the second module 18. In the present embodiment, the change in the angular orientation of the second module 18 relative to the first module 16 depends on the narrowness of the grid of the respective hole patterns.

As an alternative, it is conceivable that the flange face 32 of the second module 18 has a pattern of elongated holes. This allows almost continuous adjustment of the angular orientation of the second module 18 with respect to the first module 16.

In the connection area 22, the first module 16 and the second module 18 presently have a rotationally symmetrical cylindrical transition area 36. In the region of the transition area 36, the first module 16 and the second module 18 telescope into one another, or in other words, the second module 18 is circumferentially enclosed by the first module 16. This means that the first module 16 and the second module 18 each have axially abutting surfaces in the transition area 36, via which the first module 16 and the second module 18 are centered relative to one another.

The second module 18 is connected to the cover element 20 in a connection area 24, which is of identical form as connection area 22. For example, the connection area 24 has a flange 38 (not shown here) for connecting the second module 18 to the cover element 20, and a rotationally symmetrical cylindrical transition 40, each having axially abutting surfaces, with the second module 18 radially engaging around the cover element 20 in the region of the transition 40.

The housing assembly 12 is connected to a drive housing 56 (not shown here) of the process valve (not shown here either) via a mechanical interface formed on the first module 16. The connection can be made by means of a screw joint, for example. Furthermore, the first module 16 as well as the second module 18 each have connection feedthroughs 44 (not shown here) by means of which lines (not shown here either) are connected. The lines are connected to a control unit 48 via a connection interface 46. In the present embodiment, the connection interface 46 is implemented with connection terminals 50, which are mechanically fastened to a support plate 52.

The connection interface 46 arranged in the second module 18 is spatially separated from the control unit 48 mounted in the first module 16, thus making clever use of the available installation space of the housing assembly. As a result, the first module 16 can be designed to have a compact overall length, for example.

The connection interface is connected to the control unit via electrical wiring 53, which in the present embodiment is assigned to the feedthrough 55 that can be designed to be pressure resistant. For example, owing to a flameproof feedthrough of the electrical signal connection, the ignition protection provided for the enclosed space between the cover element 20 and the second module 18 can be different or lower as compared to the enclosed space between the first module 16 and the second module 18.

In the present embodiment, the control unit 48 comprises a two-piece circuit board 58, with the two parts being arranged the one above the other. The circuit board 58 is mounted in a fixed position in the first module 16. It is used as a monitoring, control and/or regulating unit for the valve unit 14 (not shown here). In the present embodiment, the control unit 48 is electrically connected both to an IP converter 74, which is arranged in the first module 16, and to position detection sensing means (not shown here) that is also arranged in the first module 16.

The control unit 48 enables bidirectional communication with the electric field device 10. For this purpose, the control unit 48 has an interface to a control center, which allows the electric field device 10 to be monitored and/or operated from a distance from its installation site.

In the present embodiment, bidirectional communication with the control unit 48 is via an operating unit 62 which comprises a support member 64 which has a display, an indicator and/or a control element arranged thereon. In the present embodiment, the display and/or indicator element 66 is arranged behind a pressure-resistant viewing window 68 in a recess 54 in the second module 18, and the support element 64 has a releasable mechanical connection 70 to the second module 18, thus ensuring a stationary arrangement of the support element 64 in a constant position with respect to the second module 18. The support element 64 of the control unit 62 is electrically connected to the control unit 48 via a detachable communication connection, which in the present case takes the form of a cable connection 60.

When there is a change in angle of the second module 18 relative to the first module 16, the support element 64 and/or the operating unit 62 undergoes the same change in angle, so as to ensure that the position of the operating unit 62 relative to the second module 18 remains unchanged. Because of the flexibility of the cable connection 60, the support element 64 can rotate nearly 360° with respect to the circuit board 58 of the control unit 48. A mechanical stop (not shown here) limits the angular orientation of the second module 18 with respect to the first module 16, in particular to prevent the cable connection 60 from being impaired by overtwisting.

In the present embodiment, the position of the operating unit 62, which comprises the support element 64 and the display and/or indicator element 66, can be changed exclusively via the angular orientation of the second module 18 relative to the first module 16, with the position of the operating unit 62 relative to the second module 18 remaining unchanged. This allows the position of the operating unit 62 to be easily adapted to the specific installation space conditions of the plant to ensure good accessibility, simple readability and easy operation.

The same is true for the connection feedthroughs (not shown here) of the second module 18, whose position can be adapted to the specific installation space conditions of the process plant by changing the angular orientation of the second module 20 with respect to the first module 18.

Figure 2:
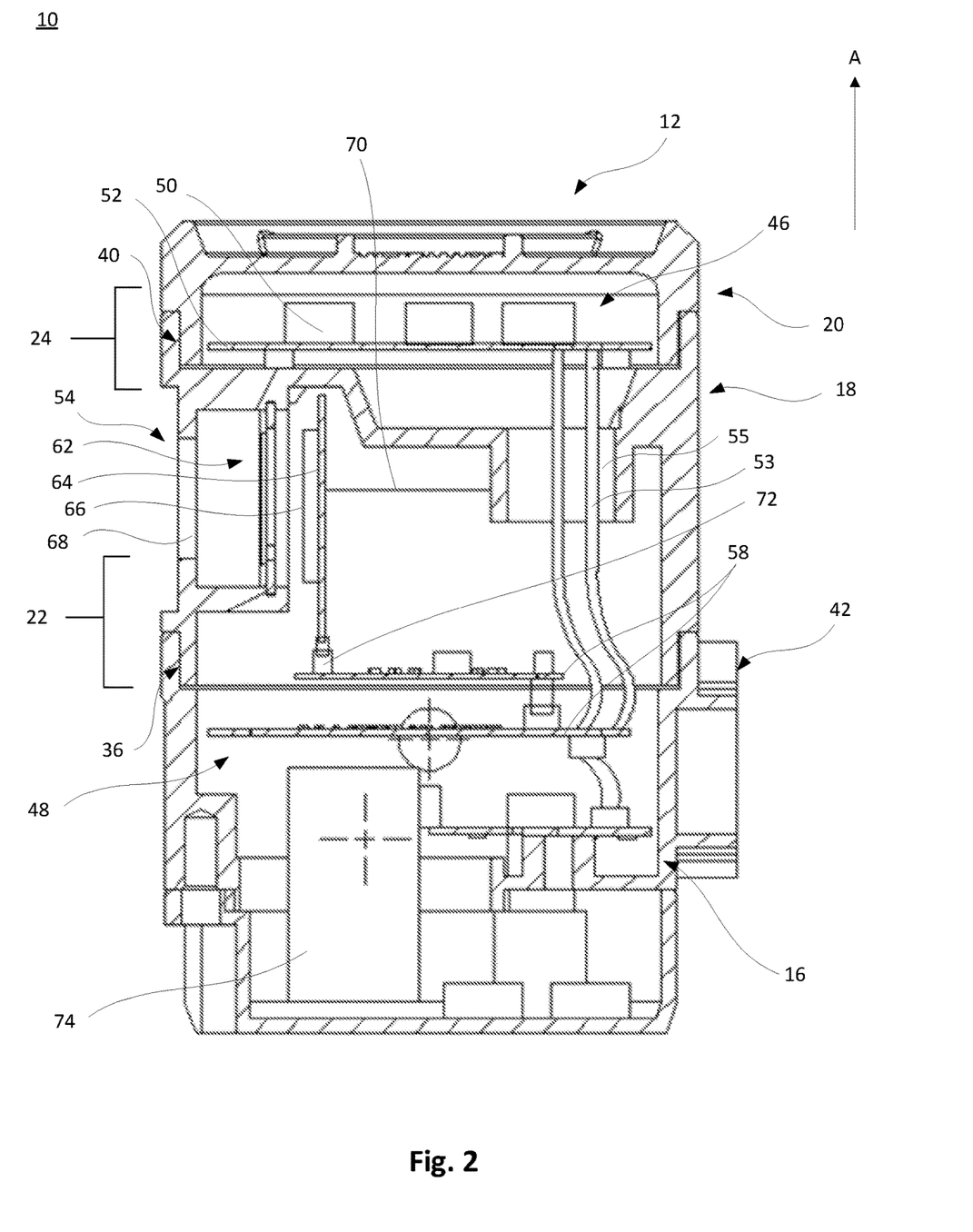
FIG. 2 is an axial longitudinal sectional view of an alternative embodiment of an electric field device according to the invention.

FIG. 2 is an axial longitudinal sectional view of an alternative embodiment of the positioner 10. The housing assembly 12 comprises the first module 16, the second module 18 and the cover element 20, which are each connected to one another via the connection areas 22, 24. The connection areas 22, 24 each have a rotationally symmetrical cylindrical transition 36, 40. In the regions of the respective transitions 36, 40, the respective housing components 16, 18, 20 telescope into one another and each have axially abutting surfaces via which the housing components 16, 18, 20 are centered relative to one another.

In the connection areas 22, 24, the housing components 16, 18, 20 can be connected to one another, as already described above with respect to FIG. 1, for example via a flange 26, 38 (not shown here). As an alternative, it is conceivable that the second module 18 is continuously adjustable relative to the first module 16, in that the first module 16 as well as the second module 18 have an external thread formed in the connection area 22, which thread can be screwed into an internal thread of a movable threaded piece, for example a union nut. In an advantageous manner, the connection via a rotary joint has a small gap. In particular, the movable threaded piece can radially engage around the connection area 22 and can be secured in place via a shoulder formed on the housing 16, for example. The continuously adjustable angular orientation of the second module 18 relative to the first module 16 allows the second module 18 to be optimally adapted to the installation space conditions of a process plant by means of rotating it with respect to the first module 16.

As already described with regard to FIG. 1, the first module 16 has a mechanical interface 42 for fixing it to a drive housing 56 (not shown here) of a process valve (not shown here either). The first module 16 as well as the second module 18 each have connection feedthroughs 44 (not shown here) which are used to connect lines (not shown here either) that are electrically connected to a control unit 48 of the positioner 10.

The control unit 48, which is installed in a stationary manner relative to the first module 16, comprises in particular a two-piece circuit board 58, as described with regard to FIG. 1. The control unit 48 and a support element 64 of the operating unit 62 are connected to one another via a detachable communication connection. In particular, they are connected via a plug-in connector 72 formed on the circuit board 58 which receives the support element 64 to which a display, indicator and/or operating element is attached. The circuit board 58 has a plurality of plug-in connectors 72 in different positions, so that the position of the support element 64 on the circuit board 58 can be changed by replugging.

The circuit board 58 reflects the symmetry requirements of the second module 18 via the plug-in connectors 72, which allows the position of the display and/or display element 66 to be optimally adapted to the position of the recess in the second module 18. In the case of an angular orientation of the second module 18 with respect to the first module 16, replugging the support element 64 is done in such a way that the stationary arrangement of the support element 64 with respect to the second module 18 will be ensured. This means that the support element 64 is replugged in such a way that the display and/or indicator element 66 of the operating unit 62 remains arranged behind a pressure-resistant viewing window 68 in a recess of the second module 18. In addition to being connected to the circuit board 58 by means of a plug-in connection 72, the support element 64 may be connected to the second module 18 by means of a mechanical connection 70.

Figure 3:
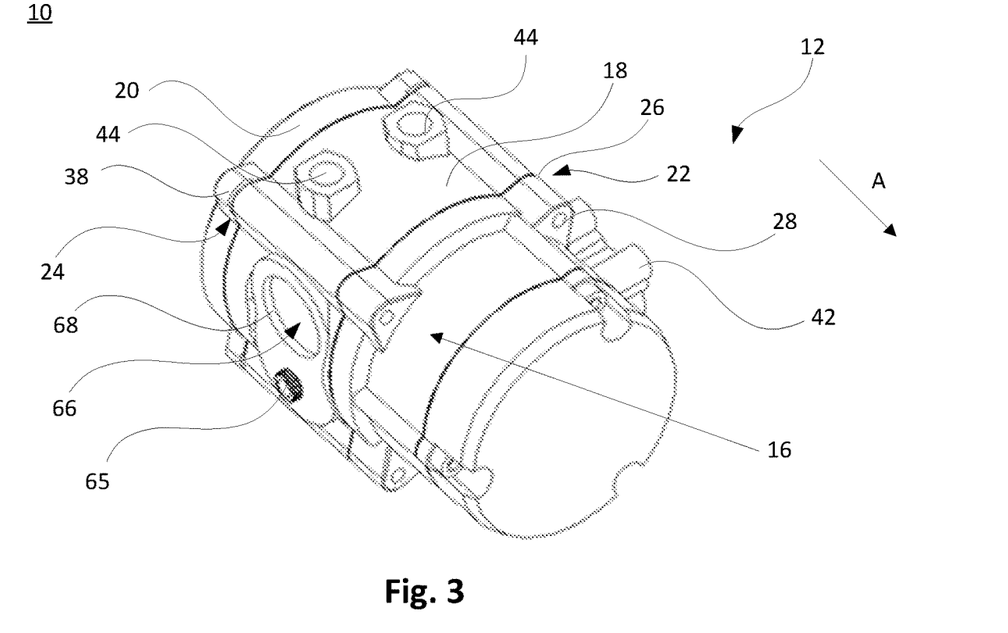
FIG. 3 is a perspective view of an electric field device according to the invention.

FIG. 3 is a perspective view of an electric field device 10 according to the present invention, which is configured as a positioner 10 and comprises a housing assembly 12 with a modular structure having a first module 16, a second module 18 and a cover element 20.

The first module 16 has a mechanical interface 42, via which it can be connected in a stationary manner to a drive housing 56 (not shown here) of a process valve.

The first module 16 as well as the second module 18 have connection feedthroughs 44, to which lines (not shown here) can be connected which serve to electrically connect the positioner 10 to a drive of the process valve. In the circumferential direction, the second module 18 has a plurality of terminal feedthroughs 44.

Furthermore, the second module 18 has a viewing window 68 which is provided with a pressure-resistant glass pane, for example, behind which a display and/or indicator element 66 of an operating unit 62 is located that is arranged in a stationary manner with the second module 18. In the present embodiment, the operating unit 62 also has an operating element 65, for example an operating screw 65, which passes through the second module 18 and which can be used to operate the electric field device 10 from outside of the housing 12.

In the present embodiment, the first module 16 is indirectly connected to the cover element 20 with the second module 18 interposed therebetween. The connection of the respective housing components 16, 18, 20 is made in a respective connection area 22, 24. The respective connection areas 22, 24 are uniformly defined, so that the first module 16 can be connected to the cover element 20 selectively either indirectly, via the second module 18, or directly to the cover element 20. For this purpose, in the present embodiment, the connection areas 22, 24 each have a flange 26, 38 via which the respective housing components 16, 18, 20 are connected to one another in a releasable manner. The flanges 26, 38 have bores 34 for screw connections 28, via which a contact pressure is applied to the respective flange 26, 38.

Figure 4:
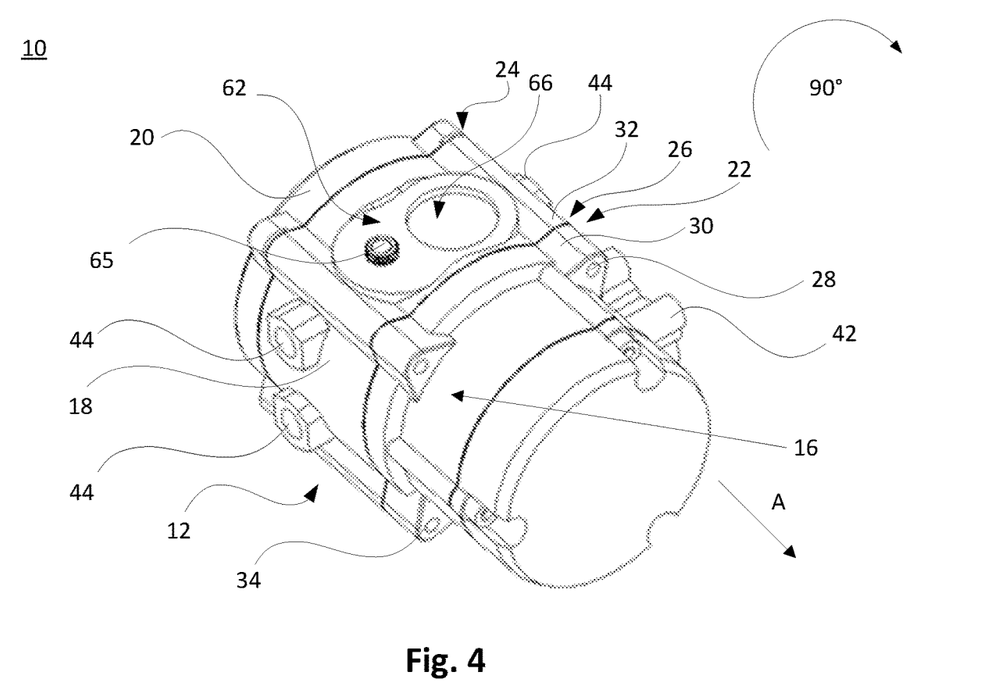
FIG. 4 is a perspective view of an electric field device according to the invention with a changed angular orientation of a second module according to FIG. 3.

It is apparent from the view of FIG. 4 that the second module 18 of the housing assembly 12 can be fixed relative to the first module 16 in different angular orientations about the longitudinal axis A, with the longitudinal axis A extending orthogonally to the plane connecting the first module 16 to the second module 18. This means that the second module 20 can be axially aligned with respect to the first module 18 at different rotational angles, as can be seen from a comparison of the views of FIGS. 4 and 3.

In particular, the connection region 22 has a flange 26 for connecting the first module 16 to the second module 18. The flange 26 has flange faces 30, 32 formed on the first module 16 and the second module 18, respectively. The respective flange faces 30, 32 have holes 34 that form a hole pattern. The first module 16 and the second module 18 are centered relative to each other via a pair of holes of the hole patterns of the respective flange faces 30, 32. The angular orientation of the second module 18 relative to the first module 16 can be varied via the pair of holes of the flange 26, the change in angular orientation being dependent on the narrowness of the grid of the respective hole patterns of the flange faces 30, 32. In the present embodiment, the second module 18 is rotated, for example, by 90° about the longitudinal axis A relative to the second module 18 shown in FIG. 3. This allows the angular orientation of the second module 18 relative to the first module 16 about the longitudinal axis of the electric field device 10 to be adjusted in an advantageous manner, with the result that the operating unit 62 formed on the second module 18 and connection feed-throughs 44 can assume a position that is optimally adapted to the available installation space of the plant.

Figure 5:
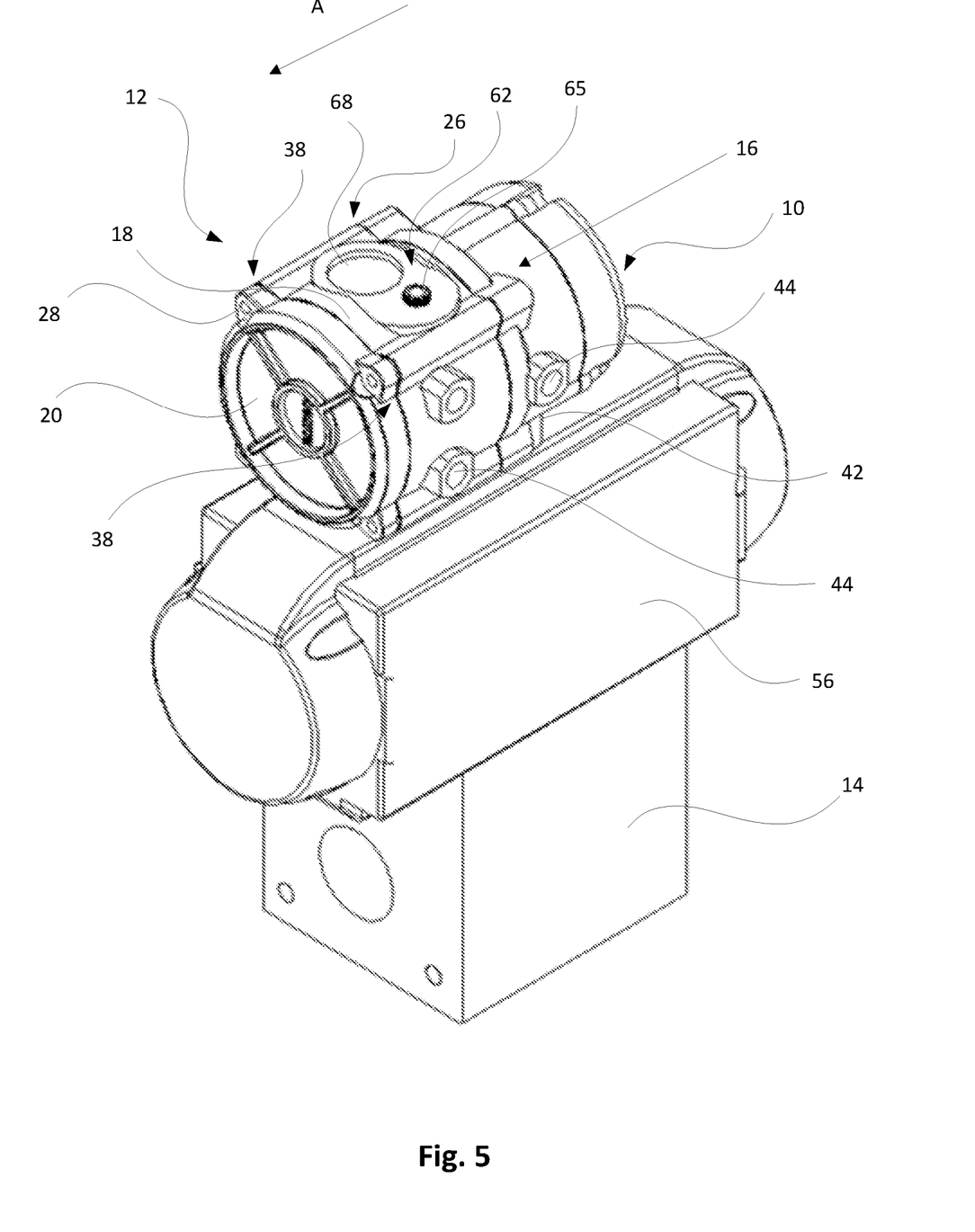
FIG. 5 is a view of an electric field device according to the invention that is arranged on a drive housing of a valve unit.

FIG. 5 is a view of the positioner 10 shown in FIG. 3 and FIG. 4 in an arrangement with a drive housing 56 of a drive of a valve unit 14. The housing assembly 12 with a modular structure shows the first module 16 that is connected to the second module 18 via the flange 26, which second module 18 in turn is connected to the cover element 20 via the flange 38.

The first module 16 is provided with a mechanical interface 42 that is used for connection to the drive housing 56. In particular, this connection can be made via a screw connection. Integrated in the first module 16 are the IP converter 74 for controlling the discharge pressure and the position detection sensing means for detecting the actuator position of the valve unit 14. These components communicate with the control unit 48 for positioning and/or controlling the actuator of the valve unit 14. The first module 16 as well as the second module 18 comprise connection feed-throughs 44, via which lines (not shown here) are connected, for an electrical connection of the positioner.

In addition to the connection feedthroughs 44, the second module 18 has an operating unit 62 that has a display element, an indicator element and/or operating element. The display element and/or the indicator element is arranged in a recess in the second module 18, behind a pressure-resistant viewing window 68. The positioner 10 can be operated from outside of the housing 12 via the operating element 65 of the operating unit 62.

The first module 16 is secured to the actuator housing 56 in a stationary position via the mechanical interface 42. The second module 18 can be fixed in different angular orientations about the longitudinal axis A relative to the first module 16 and, consequently, relative to the drive housing 56. As a result, the positions of the respective connection feedthroughs 44 and of the operating unit 62 or of the display, indicator and/or operating elements 66, 65, which are each arranged in a stationary manner relative to the second module 18, can be optimally adapted to the specific installation space of the process plant via the different angular orientations of the second module 18. This allows the position of the operating unit 62 to be easily adapted to the specific installation space of the plant, in order to ensure good accessibility, simple readability and easy operation. The same is true for the position of the connection feedthroughs 44 by means of which the supply conditions of the electric lines can be easily adapted to the installation conditions of the plant.

In FIGS. 1 to 5, the electric field devices 10 according to the invention each have a housing assembly 12 in which the first module 16 is mechanically connected indirectly to the cover element 20 with the interposition of the second module 18.

Figure 6:
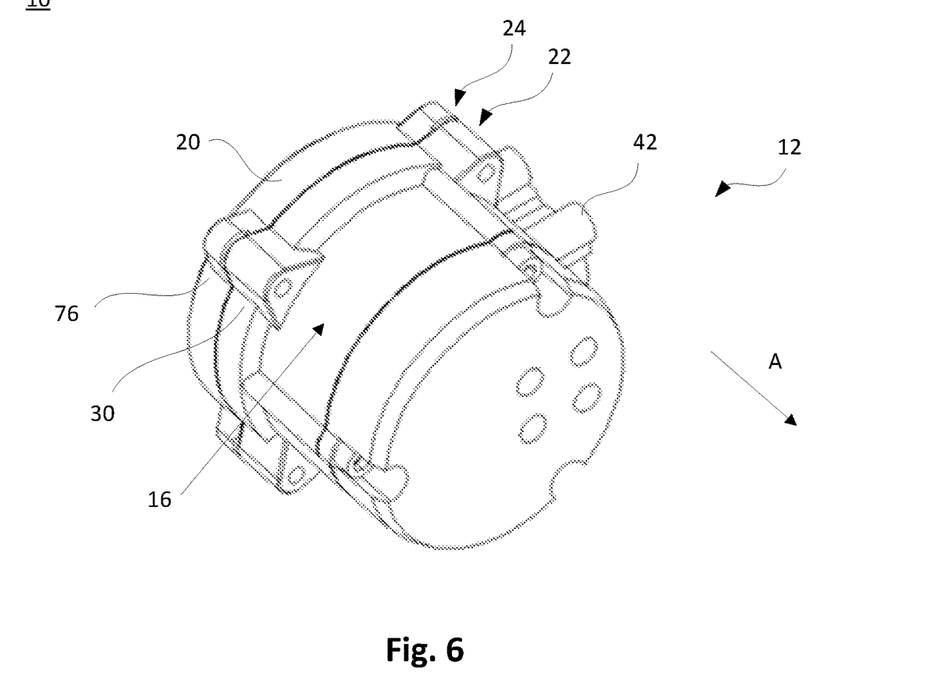
FIG. 6 is a perspective view of an alternative configuration of a housing assembly of an electric field device according to the invention.
Figure 7:
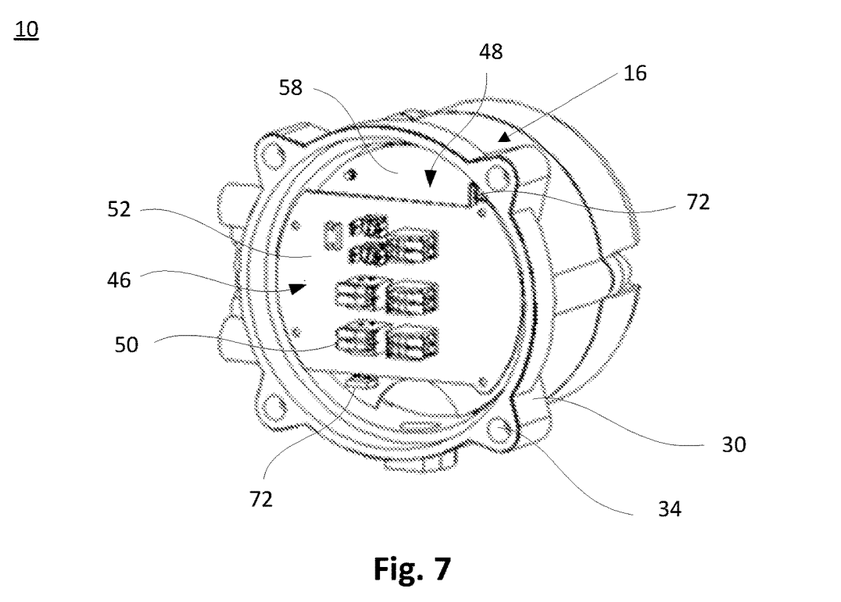
FIG. 7 is a perspective axial top view of a first module of an electric field device according to the invention.

FIGS. 6 and 7 each are a perspective view of an alternative configuration of the housing 12 of the positioner 10, using a uniform first module 16 as well as a uniform cover element 20. The first module 16 as well as the cover element 20 both serve as base bodies for the respective different configurations of the housing assembly 12. Due to the fact that the first module 16, the second module 18 and the cover element 20 each have uniformly defined connection areas 22, 24 via which they can be connected to one another, the first module 16 can be directly connected to the cover element 20, as is shown in FIG. 6.

In the present embodiment, the connection area 22 of the first module 16 and the connection area 24 of the cover element 20 are centered in relation to one another. The connection areas 22, 24 each have a flange face 30, 76 with holes that form a hole pattern. Via a pair of holes of the respective hole patterns, the flange faces 30, 76 are screwed together in the present case.

Advantageously, the present configuration of the housing assembly 12 comprising the first module 16 and the cover member 20 has a simplified arrangement with a reduced number of housing components 16, 20. As a result, the positioner 10 is smaller in size, in particular has a smaller axial extent. Due to the short overall length of the present housing 12, the positioner 10 can be easily adapted to a process plant which only has a small installation space available, for example. The positioner is connected to a drive housing 56 of a valve unit 14 via the mechanical interface 42 formed on the first module. The positioner is electrically connected to a drive of the valve unit via connection feedthroughs 44 (not shown here) that are also formed on the first module 16.

FIG. 7 is a perspective axial top view of the first module 16 of the housing 12 according to FIG. 6.

The IP converter 74 (not shown here) for controlling the discharge pressure, the position detection sensing means (not shown here either) for detecting the actuator position of the valve unit 14, and the control unit 48 are all arranged in the first module 16.

The control unit 48 is arranged in a stationary manner relative to the first module 16. In the present embodiment, it has a PCB or board 58, which is in particular mounted in the first module 16. Plug-in connectors 72 are arranged on the circuit board 58, via which the support element 64 of the operating unit 62 can be electrically connected to the control unit 48. The positions of the plug-in connectors 72 reflect the symmetry of the bores of the flange face 30 and thus the symmetry requirements of the second module 18. In the present configuration of the housing 12 of the positioner 10, the support element 64 or the operating unit 62 and the second module 18 are eliminated.

For bidirectional communication with the electric field device 10, the control unit 48 includes an interface to a control center. The control center can be electrically connected to the control unit 48 via the connection interface 46, which is formed separately from the control unit 48. For this purpose, the connection interface 46 of the present embodiment has connection terminals 50 which are attached to a support plate 52. The support plate 52 can, for example, be mounted in a stationary manner in the first module 16.

Communication between the control center and the control unit 48 is done via a BUS system, for example. This for example allows the control unit 48 to be monitored and/or operated from a distance from the installation location of the housing 12 of the electric field device 10. The present arrangement of the electric field device 10 is advantageous, for example, for process plants that are difficult to access, are exposed to particularly harsh environmental conditions or to increased vibration loads.

LIST OF REFERENCE SIGNS 10 electric field device
12 housing
14 valve unit
16 first module
18 second module
20 cover element
22 connection area
24 connection area
26 flange
28 screw connection
30 flange face
32 flange face
34 bores
36 transition area
38 flange
40 transition area
42 interface
44 connection feedthroughs
46 connection interface
48 control unit
50 terminals
52 support plate
53 electrical wiring
54 recess
55 feedthrough (optionally pressure-resistant)
56 drive housing
58 two-piece circuit board
60 cable connection
62 operating unit
64 support element
65 operating element
66 display and/or indicator element
68 viewing window
70 mechanical joint
72 plug-in connector
74 IP converter
76 flange face

The invention claimed is:

1. Electric field device (10) of the ignition protection type of pressure-tight encapsulation for use in explosion-prone regions for controlling and/or regulating a valve unit of a process plant, comprising a housing (12) in which a control unit (48) that comprises electronic components and is used as a monitoring, control and/or regulating unit is arranged, said the control unit (48) having a releasable communication connection to an operating unit (62), said housing (12) being adapted to be connected to a drive housing of the valve unit via a mechanical interface (42), and said housing having at least one connection feedthrough (44), via which at least one line can be connected that is connected to the control unit (48) via a connection interface (46), characterized in that said housing (12) is designed as a housing assembly with a modular structure, having a first module (16) which is formed together with the mechanical interface (42) to the drive housing and the connection feedthrough (44), said control unit (48) being secured in the first module (16) and having an interface to a control center, wherein the first module (16) can be mechanically connected to a cover element (20) selectively either directly or indirectly in a releasable manner, and the indirect connection of the first module (16) to the cover element (20) is produced with the interposition of a second module (18), wherein the operating unit (62) is arranged in a stationary manner in the second module (16), and wherein the second module (18) can be fixed in different angular orientations about a longitudinal axis of the electric field device relative to the first module (16).

2. Electric field device according to claim 1, characterized in that said control unit (48) comprises a circuit board (58) that is electrically connected to the connection interface (46), said connection interface (46) comprising terminals (50) that are arranged in a second module (18) below a cover element (20).

3. Electric field device according to claim 1, characterized in that said operating unit (62) comprises a support element (64) on which a display, an indicator and/or an operating element (65) are arranged.

4. Electric field device according to claim 1, characterized in that said electrically detachable communication connection between the control unit (48) and the operating unit (62) is produced by means of the circuit board (58) and the support element (64), wherein they can be arranged in different angular orientations relative to one another via a connection element.

5. Electric field device according to claim 4, characterized in that said connection element is formed as a plug-in connector on the circuit board (58) of the control unit (48), the circuit board (58) having a plurality of plug-in connectors in different positions.

6. Electric field device according to claim 4, characterized in that said connection element is provided in the form of a cable connection.

7. Electric field device according to claim 1, characterized in that said first module (16), said second module (18) and said cover element (20) all have a connection area (22, 24) via which they can each be mechanically connected to one another.

8. Electric field device according to claim 7, characterized in that said respective connection areas have a rotationally symmetrical cylindrical transition area (36), with the respective connection areas engaging in one another in such a way that they each have axially abutting surfaces.

9. Electric field device according to claim 7, characterized in that said respective connection areas (22, 24) can be connected to one another via a positive and/or non-positive connection.

10. Electric field device according to claim 9, characterized in that said connection is produced in the axial direction via a screw connection of a pair of holes of the respective connection areas.

11. Electric field device according to claim 6, characterized in that said connection area (22) between the first and the second module is designed in such a way that the connection area of the first module can be adjusted continuously.

12. Electric field device according to claim 11, characterized in that said connection area of the second module has a pattern of elongated holes.

13. Electric field device according to claim 11, characterized in that said first module (16) has a rotational stop with respect to the second module (18).

14. Electric field device according to claim 1, characterized in that said second module (18) has at least one connection feedthrough.

15. Electric field device according to claim 1, characterized in that a position detection sensing means for a position measurement of a valve member position is arranged in the first module.

16. Electric field device according to claim 1, characterized in that an IP converter is arranged in the first module.

17. Process valve of a process plant, comprising a valve unit which has a control valve and a drive that is arranged in a drive housing, said drive housing being connected to an electric field device which is used to control and/or regulate an actuator of the control valve, characterized in that said electric field device (10) IS of the ignition protection type of pressure-tight encapsulation for use in explosion-prone regions for controlling and/or regulating a valve unit of a process plant, comprising a housing (12) in which a control unit (48) that comprises electronic components and is used as a monitoring, control and/or regulating unit is arranged, said the control unit (48) having a releasable communication connection to an operating unit (62), said housing (12) being adapted to be connected to a drive housing of the valve unit via a mechanical interface (42), and said housing having at least one connection feedthrough (44), via which at least one line can be connected that is connected to the control unit (48) via a connection interface (46), said housing (12) is designed as a housing assembly with a modular structure, having a first module (16) which is formed together with the mechanical interface (42) to the drive housing and the connection feedthrough (44), said control unit (48) being secured in the first module (16) and having an interface to a control center, wherein the first module (16) can be mechanically connected to a cover element (20) selectively either directly or indirectly in a releasable manner, and the indirect connection of the first module (16) to the cover element (20) is produced with the interposition of a second module (18), wherein the operating unit (62) is arranged in a stationary manner in the second module (16), and wherein the second module (18) can be fixed in different angular orientations about a longitudinal axis of the electric field device relative to the first module (16).

* * * * *